United States Patent
Kawahito et al.

(10) Patent No.: US 6,700,417 B2
(45) Date of Patent: Mar. 2, 2004

(54) SAMPLING AND HOLD CIRCUIT

(75) Inventors: Shoji Kawahito, Hamamatsu (JP); Daisuke Miyazaki, Hamamatsu (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 10/300,864

(22) Filed: Nov. 21, 2002

(65) Prior Publication Data

US 2003/0122592 A1 Jul. 3, 2003

(30) Foreign Application Priority Data

Nov. 21, 2001 (JP) ........................................ 2001-356081

(51) Int. Cl.[7] .......................... H03K 17/00; H03K 5/00; G11C 27/02
(52) U.S. Cl. .......................................... 327/94; 327/96
(58) Field of Search ............................. 327/91, 94, 95, 327/96, 337, 344, 554

(56) References Cited

U.S. PATENT DOCUMENTS 5,689,201 A * 11/1997 Temes et al. .................. 327/95
5,914,638 A    6/1999 He .............................. 330/258
6,215,337 B1 * 4/2001 Bazarjani ..................... 327/91

FOREIGN PATENT DOCUMENTS

EP         0532108 A1    3/1993

OTHER PUBLICATIONS

Zhuo, Wei et al., "Using Capactivie Cross–Coupling in RF Low Noise Amplifiers and Down–Conversion Mixer Design," ESSCIRC Dig. Tech Papers, Sep. 2000, pp. 116–119.

Cho, Thomas et al., "A single–Chip CMOS Direct–Conversion Transceiver for 900MHz Spread–Spectrum Digital Corless Phones," Solid–Sate Circuits Conference, 1999, Digest of Technical papers, ISSCC 1999, IEEE International San Francisco, CA, USA, Feb. 15–17, 1999, Piscataway, NJ, USA, IEE, US, Feb. 15, 1999, pp. 228–299.

Tenten, W.J., "New CMOS High–Speed, High Accuracy Auzo–Zero Comparator Design Based on Symmetric Cross–Coupled Concepts," International Journal of Electronics, Taylor and francis LTD, London, GB, vol. 68, No. 3, Mar. 1, 1990, pp. 405–412.

* cited by examiner

*Primary Examiner*—Tuan T. Lam
(74) *Attorney, Agent, or Firm*—Birch, Stewart, Kolasch & Birch, LLP

(57) ABSTRACT

A sampling and hold circuit that can suppress voltage variation at the input terminals, which are virtual grounds, of a differential amplifier, depending on the frequency of input signals. During sampling operation, a serial circuit composed of a capacitor C1, to which a positive-side input voltage ViP is applied, and an NMOS transistor Q4, which is always turned on, is connected to an input terminal INP of a differential amplifier circuit 2. A serial circuit having the same impedance as that serial circuit and composed of a capacitor C3, to which a negative-side input voltage ViM is applied, and an NMOS transistor Q9 is also connected to the input terminal INP. A serial circuit composed of a capacitor C2, to which a negative-side input voltage ViM is applied, and an NMOS transistor Q5, which is always turned on, is connected to the other input terminal INM of a differential amplifier circuit 2. A serial circuit having the same impedance as that serial circuit and composed of a capacitor C4, to which a positive-side input voltage ViP is applied, and an NMOS transistor Q10 is also connected to the input terminal INM.

3 Claims, 5 Drawing Sheets

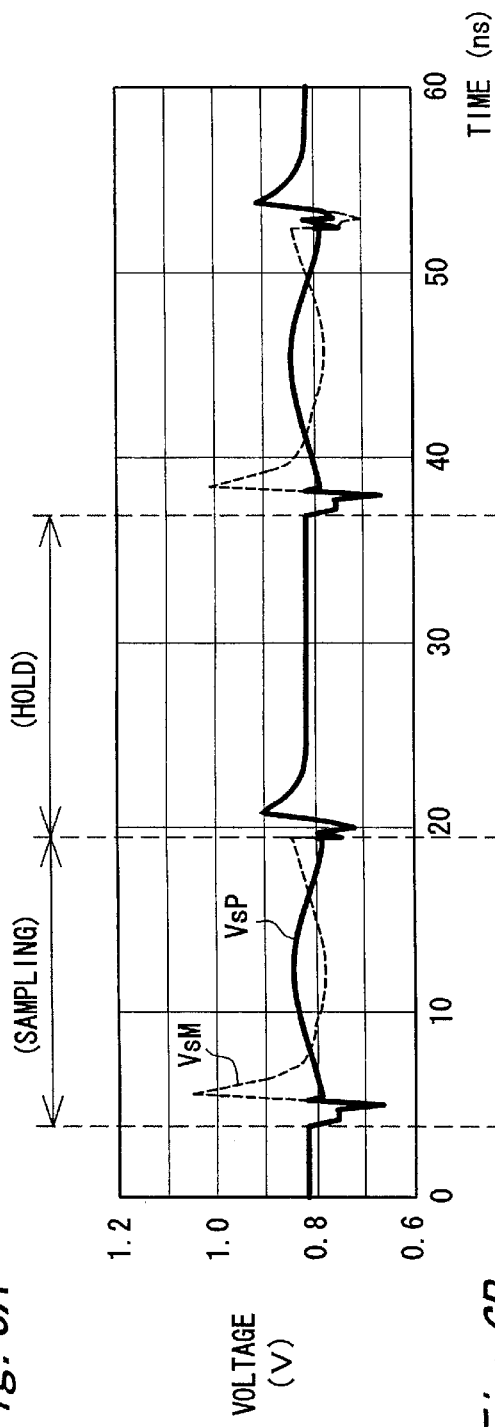
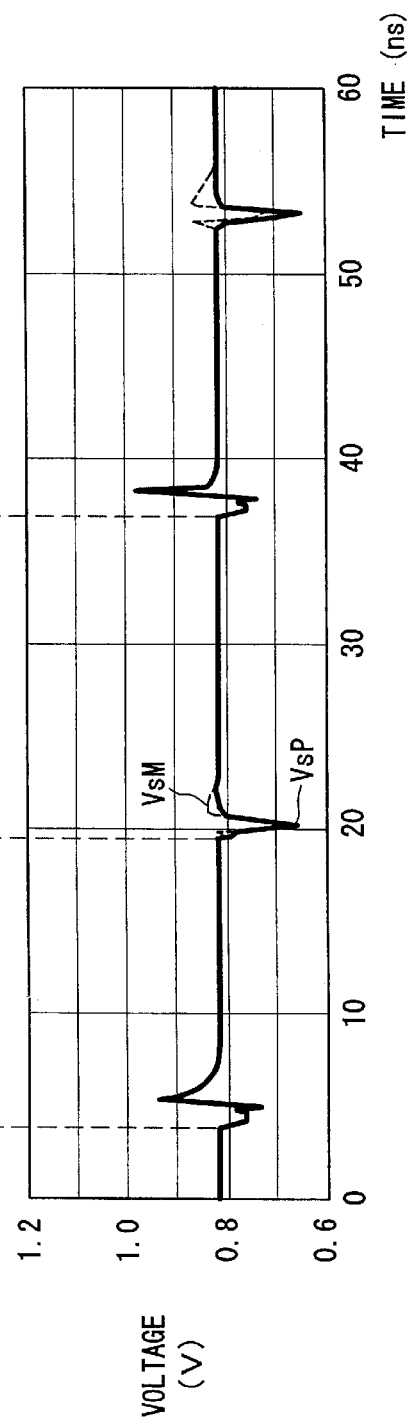
Fig. 6A
Fig. 6B

SAMPLING AND HOLD CIRCUIT

This nonprovisional application claims priority under 35 U.S.C. §119(a) on Patent Application No. 2001-356081 filed in JAPAN on Nov. 21, 2002, which is herein incorporated by reference.

BACKGROUND OF THE INVENTION

1. Field of the Invention

The present invention relates to a sampling and hold circuit that samples and holds a pair of input signals having mutually opposite voltage levels.

2. Description of the Related Art

A prior sampling and hold circuit is described in the following with reference to FIG. 7. The sampling and hold circuit 100 in FIG. 7 includes a differential amplifier circuit 101, NMOS transistors Qa through Qf, and capacitors Ca and Cb. Clock signals CK1, CK2, and CK2B are respectively input to the gates of NMOS transistors Qb, Qc, and Qa from a clock-signal generator circuit (not illustrated). The clock signals CK1, CK2, and CK2B are also respectively input to the gates of NMOS transistors Qe, Qf, and Qd. The clock signal CK2B is a signal obtained by inverting the signal level of the clock signal CK2.

This sampling and hold circuit 100 has a positive-side input terminal 105 and a negative-side input terminal 106. A positive-side analog signal is input to positive-side input terminal 105, and a negative-side analog signal is input to negative-side input terminal 106. The positive-side and negative-side analog signals are a pair of signals having mutually opposite signal levels. The sampling and hold circuit 100 samples, holds and then outputs the input analog signals based on the predetermined clock signals output from the clock-signal generator circuit.

When the sampling and hold circuit 100 performs sampling, NMOS transistors Qa, Qb, Qd, and Qe are turned on, and NMOS transistors Qc and Qf are turned off to thereby assume a cut-off state. In this way, the input voltage ViP of the positive-side analog signal input to positive-side input terminal 105 is sampled to capacitor Ca, and the input voltage ViM of the negative-side analog signal input to negative-side input terminal 106 is sampled to capacitor Cb.

Next, when holding is performed, NMOS transistors Qa, Qb, Qd, and Qe are turned off to assume the cut-off states, and NMOS transistors Qc and Qf are turned on to assume conductive states. In this way, the voltage sampled to capacitor Ca is held and input to one input terminal INP of differential amplifier circuit 101, and output as a positive-side output voltage VoP from the output terminal 107 corresponding to input terminal INP. Similarly, the voltage sampled to capacitor Cb is held and input to the other input terminal INM of differential amplifier circuit 101, and output as a negative-side output voltage VoM from the output terminal 108 corresponding to input terminal INM.

Here, we assume that the mutual conductance at input terminal INP of differential amplifier circuit 101 and the mutual conductance at input terminal INM of differential amplifier circuit 101 are the same gm. FIG. 8 shows an equivalent circuit of sampling and hold circuit 100 during the sampling stage in this case. In FIG. 8, the equivalent resistance of NMOS transistor Qa while Qa is turned on is denoted by Ra, and the equivalent resistance of NMOS transistor Qd while Qd is turned on is denoted by Rd. In FIG. 8, when the frequency of the analog signals input to positive-side input terminal 105 and negative-side input terminal 106 becomes high, the impedances of capacitors Ca and Cb decline.

Therefore, the voltages VsP and VsM at the input terminals of differential amplifier circuit 101 are originally a virtual ground voltage, but there has been a problem that they greatly vary from the virtual ground voltage. Therefore, when such a sampling and hold circuit is used, for example, in an analog-to-digital (A-D) converter, if the frequency of the analog signals input to sampling and hold circuit 100 becomes equal to or greater than the Nyquist frequency, the voltages greatly vary from the virtual ground voltage. Therefore, there has been a problem that distortions occur by the influence of non-linearity of switches, amplifiers, and the like, so that the SNDR of the A-D converter deteriorates.

SUMMARY OF THE INVENTION

The present invention has been made to eliminate the above problems and has for Its object to obtain a sampling and hold circuit that can suppress voltage variation at the input terminals of a differential amplifier circuit that form virtual grounds, depending on the frequency of input analog signals.

To this end, a sampling and hold circuit according to the present invention samples and holds, at a predetermined timing, a pair of first and second input signals having opposite voltage levels. The sampling and hold circuit is equipped with a first circuit section having a first capacitor that samples and holds the first input signal and having a predetermined impedance and a second circuit section having a second capacitor that samples and holds the second input signal and having a predetermined impedance. The voltage held by the first capacitor in the first circuit section is input to a first input terminal of a differential amplifier circuit section, and the voltage held by the second capacitor in the second circuit section is input to a second input terminal of the differential amplifier section. The sampling and hold circuit is also equipped with a third circuit section having a third capacitor that has the same capacitance as that of the first capacitor, having the same impedance as that of the first circuit section during sampling operation, and inputting the second input signal to the first input terminal of the differential amplifier circuit. The sampling and hold circuit is also equipped with a fourth circuit section having a fourth capacitor that has the same capacitance as that of the second capacitor, having the same impedance as that of the second circuit section during sampling operation, and inputting the first input signal to the second input terminal of the differential amplifier circuit section.

In a preferred embodiment, the first circuit section comprises the first capacitor and a first transistor, and a predetermined voltage Vc1 is always applied to a control-signal input terminal of the first transistor. The second circuit section includes the second capacitor and a second transistor, and a predetermined voltage Vc2 is always applied to a control-signal input terminal of the second transistor. The third circuit section includes the third capacitor and a third transistor. The second input signal is input to the third capacitor, and the third transistor is turned on during sampling operation to input the second input signal to the first input terminal of the differential amplifier circuit section. The fourth circuit section comprises the fourth capacitor and a fourth transistor. The first input signal is input to the fourth capacitor, and the third transistor is turned on during sampling operation to input the first input signal to the second input terminal of the differential amplifier circuit section.

According to the sampling and hold circuit of the present invention, the influence of frequency variation in the first and second input signals and the like is canceled at the first and second input terminals of the differential amplifier circuit section, so that voltage variation at the first and second input terminals of the differential amplifier circuit section that form virtual grounds can be reduced. Therefore, when the sampling and hold circuit of the present invention is used in an A-D converter and the like, even if the frequency of analog signals becomes equal to or greater than the Nyquist frequency, the occurrence of distortions in output signals can be suppressed.

In this case, it is desirable that the predetermined voltage Vc1 is applied to the first transistor so that its equivalent resistance can become the same as the equivalent resistance of the third transistor while the third transistor is turned on, and the predetermined voltage Vc2 is applied to the second transistor so that its equivalent resistance can become the same as the equivalent resistance of the fourth transistor while the fourth transistor is turned on. By these means, the impedances of the first circuit section and the third circuit section can be easily made the same during sampling operation, and the impedances of the second circuit section and the fourth circuit section can be easily made the same during sampling operation.

Further, it is desirable that the third transistor is turned off during holding operation to cut off the connection between the third capacitor and the first input terminal of the differential amplifier circuit section. It is also desirable that the fourth transistor is turned off during holding operation to cut off the connection between the fourth capacitor and the second input terminal of the differential amplifier circuit section. By these means, the first and second input signals can be differentially amplified correctly and output during holding operation.

BRIEF DESCRIPTION OF THE DRAWINGS

The present invention will become readily understood from the following description of a preferred embodiment thereof made with reference to the accompanying drawings, in which like parts are designated by like reference symbols and in which:

FIG. 6A is a graph illustrating the variation of the voltages VsP and VsM at virtual grounds in a sampling and hold circuit as the prior sampling and hold circuit shown in FIG. 7;

FIG. 6B is a graph illustrating the variation of the voltages VsP and VsM at virtual grounds in the sampling and hold circuit shown in FIG. 1;

DESCRIPTION OF THE PREFERRED EMBODIMENT

Figure 1:
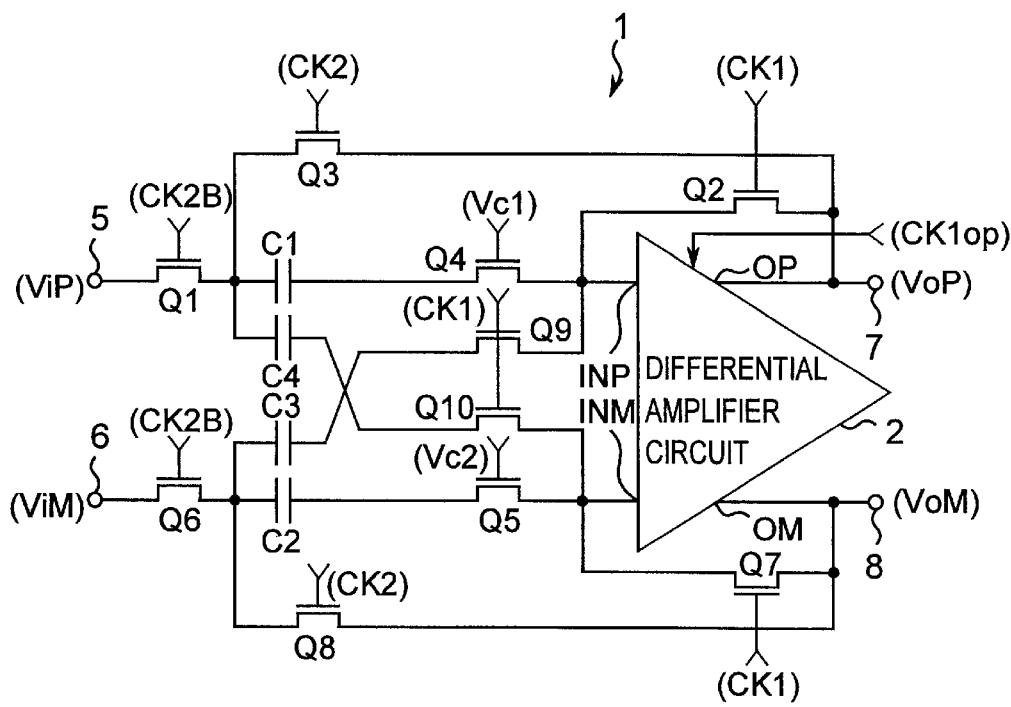
FIG. 1 is a circuitry diagram showing an exemplary sampling and hold circuit in an embodiment of the present invention.

In FIG. 1, a sampling and hold circuit 1 includes a differential amplifier circuit 2, NMOS transistors Q1 through Q10 and first to fourth capacitors C1 through C4. NMOS transistors Q4, Q5, Q9, and Q10 are respectively referred to as first, second, third, and fourth transistors.

Clock signals CK1, CK2, and CK2B are input to the gates of NMOS transistors Q1 through Q3 and Q6 through Q10 from a clock-signal generator circuit (not illustrated). Further, a predetermined voltage Vc1 is applied to the gate of NMOS transistor Q4, and a predetermined voltage Vc2 is applied to the gate of NMOS transistor Q5. The clock signal CK2B is a signal obtained by inverting the signal level of the clock signal CK2.

Sampling and hold circuit 1 has a positive-side input terminal 5 and a negative-side input terminal 6. A positive-side analog signal is input to positive-side input terminal 5, and a negative-side analog signal is input to negative-side input terminal 6. The positive-side and negative-side analog signals are a pair of signals having mutually opposite signal levels. Sampling and hold circuit 1 performs sampling, holding and outputting for the input analog signals based on the predetermined clock signals from the clock-signal generator circuit.

NMOS transistor Q1, capacitor C1, and NMOS transistor Q4 are connected in serial between positive-side input terminal 5 and one input terminal INP of differential amplifier circuit 2. NMOS transistor Q2 is connected between input terminal INP and the corresponding output terminal OP of differential amplifier circuit 2. NMOS transistor Q3 is connected between the connection between NMOS transistor Q1 and capacitor C1 on the one hand and output terminal OP of differential amplifier circuit 2 on the other hand. Also, capacitor C4 and NMOS transistor Q10 are connected in serial between the connection between NMOS transistor Q1 and capacitor C1 on the one hand and the other input terminal INM of differential amplifier circuit 2 on the other hand.

Similarly, NMOS transistor Q6, capacitor C2, and NMOS transistor Q5 are connected in serial between negative-side input terminal 6 and the other input terminal INM of differential amplifier circuit 2. NMOS transistor Q7 is connected between input terminal INM and the corresponding output terminal OM of differential amplifier circuit 2. NMOS transistor Q8 is connected between the connection between NMOS transistor Q6 and capacitor C2 on the one hand and output terminal OM of differential amplifier circuit 2 on the other hand. Further, capacitor C3 and NMOS transistor Q9 are connected in serial between the connection between NMOS transistor Q6 and capacitor C2 on the one hand and input terminal INP of differential amplifier circuit 2 on the other hand.

The clock signal CK1 is input to each gate of the NMOS transistors Q2, Q7, Q9, and Q10. The clock signal CK2 is input to each gate of the NMOS transistors Q3 and Q8. The clock signal CK2B is input to each gate of the NMOS transistors Q1 and Q6. Further, a predetermined clock signal CK1op is input to differential amplifier circuit 2 from the clock-signal generator circuit.

Figure 2:
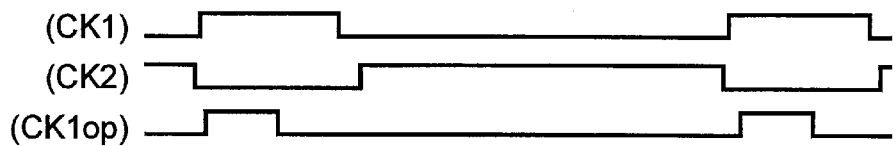
FIG. 2 is a timing diagram showing exemplary relations among the clock signals shown in FIG. 1.

In such a configuration, FIG. 2 is a timing diagram showing relations of the clock signals shown in FIG. 1. Examples of operation of sampling and hold circuit 1 shown in FIG. 1 are described in the following.

When sampling and hold circuit 1 performs sampling, NMOS transistors Q1, Q2, Q6, Q7, Q9, and Q10 are turned on and NMOS transistors Q3 and Q8 are turned off to thereby assume cut-off states. In this way, the positive-side input voltage ViP input to positive-side input terminal 5 is sampled in capacitor C1, and the negative-side input voltage ViM input to negative-side input terminal 6 is sampled in capacitor C3.

It is to be noted that capacitors C1 and C3 are the same, and capacitors C2 and C4 are the same. The predetermined voltage Vc1 is applied to the gate of NMOS transistor Q4 so that its resistance can become the same as the resistance of NMOS transistor Q9 while NMOS transistor Q9 is turned on. Similarly, the predetermined voltage Vc2 is applied to the gate of NMOS transistor Q5 so that its resistance can become the same as the resistance of NMOS transistor Q10 while NMOS transistor Q10 is turned on.

Figure 3:
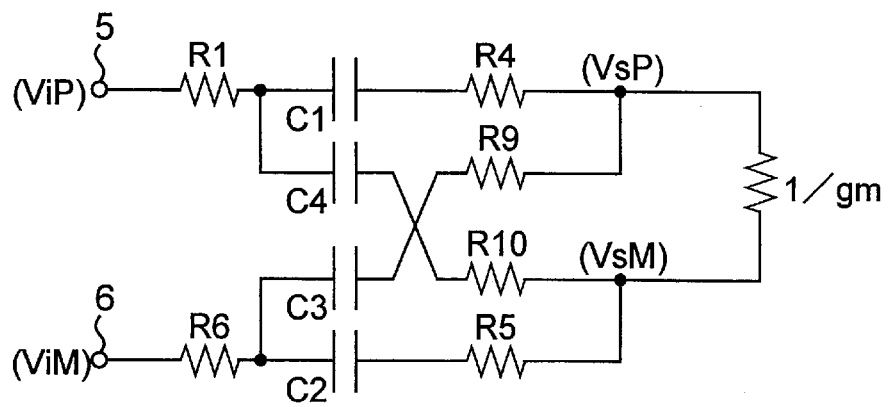
FIG. 3 is a circuitry diagram showing an equivalent circuit of the sampling and hold circuit 1 during sampling operation.

FIG. 3 is a circuitry diagram showing an equivalent circuit of sampling and hold circuit 1 while sampling operation is performed under these conditions. In FIG. 3, the mutual conductance at input terminal INP of differential amplifier circuit 2 and the mutual conductance at input terminal INM of differential amplifier circuit 2 are the same gm. The voltage at input terminal INP is denoted by VsP, and the voltage at input terminal INM is denoted by VsM.

In FIG. 3, R1 denotes the equivalent resistance of NMOS transistor Q1 while Q1 is turned on, R4 denotes the equivalent resistance of NMOS transistor Q4 to whose gate the predetermined voltage Vc1 is applied, and R10 denotes the equivalent resistance of NMOS transistor Q11 while Q10 is turned on. Similarly, R6 denotes the equivalent resistance of NMOS transistor Q6 while Q6 is turned on, R5 denotes the equivalent resistance of NMOS transistor Q5 to whose gate the predetermined voltage Vc2 is applied, and R9 denotes the equivalent resistance of NMOS transistor Q9 while Q9 is turned on.

The capacitances of capacitors C1 and C3 are the same, and the capacitances of capacitors C2 and C4 are also the same. Under these conditions, if the predetermined voltage Vc1 is set at a value so as to make R4=R9, the impedance of capacitor C1 and resistance R4 becomes the same as the impedance of capacitor C3 and resistance R9. Similarly, if the predetermined voltage Vc2 is set at a value so as to make R5=R10, the impedance of capacitor C2 and resistance R5 becomes the same as the impedance of capacitor C4 and resistance R10.

In this way, the influence of frequency variation in the analog signals input through positive-side input terminal 5 and negative-side input terminal 6 and the like is canceled at the input terminals INP and INM of differential amplifier circuit 2. Therefore, the variation of the voltage VsP at input terminal INP and the voltage VsM at input terminal INM of differential amplifier circuit 2 due to frequency variation in the analog signals input through positive-side input terminal 5 and negative-side input terminal 6 and the like is suppressed, so that the variation of VsP and VsM from a virtual ground voltage can be suppressed.

Next, when sampling and hold circuit 1 performs holding, NMOS transistors Q1, Q2, Q6, Q7, Q9, and Q10 are turned off to assume cut-off sates, and NMOS transistors Q3 and Q8 are turned on. Thus, the voltage sampled in capacitor C1 is held and input to input terminal INP of differential amplifier circuit 2, and output as the positive-side output voltage VoP from output terminal OP of differential amplifier circuit 2 through an output terminal 7. Similarly, the voltage sampled in capacitor C2 is held and input to input terminal INM of differential amplifier circuit 2, and output as the negative-side output voltage VoM from output terminal OP of differential amplifier circuit 2 through an output terminal 8.

Figure 4:
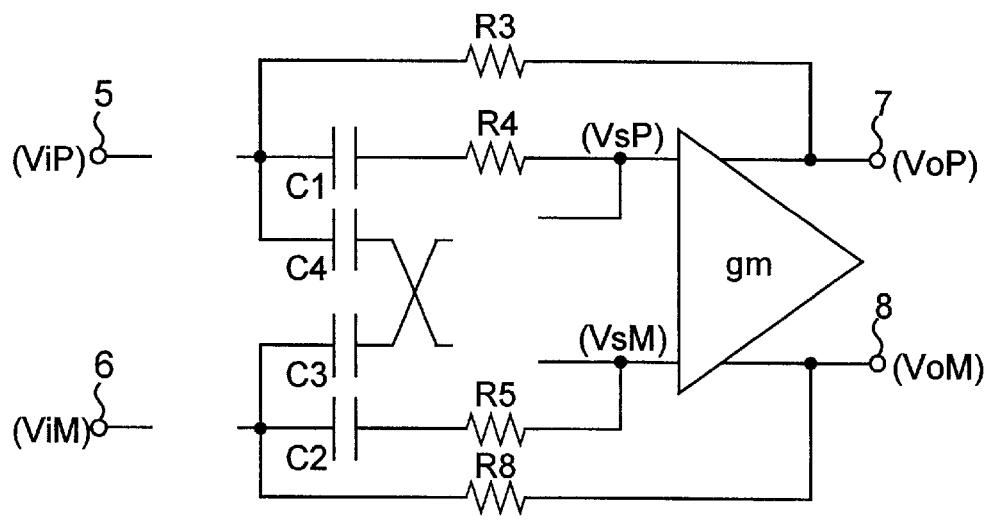
FIG. 4 is a circuitry diagram showing an equivalent circuit of the sampling and hold circuit 1 during holding operation.

FIG. 4 is a circuitry diagram showing an equivalent circuit of sampling and hold circuit 1 while such holding operation is performed. In FIG. 4, the same reference symbols as in FIG. 3 designate the same components. As seen from FIG. 4, when holding operation is performed, NMOS transistors Q9 and Q10 are turned off to assume cut-off states, so that the voltage from capacitor C3 is not input to input terminal INP of differential amplifier circuit 2, and the voltage from capacitor C4 is not input to input terminal INM of differential amplifier circuit 2. Therefore, only the voltage from capacitor C1 is input to input terminal INP of differential amplifier circuit 2, and only the voltage from capacitor C2 is input to input terminal INM of differential amplifier circuit 2, so that accurate holding operation can be performed.

Figure 5:
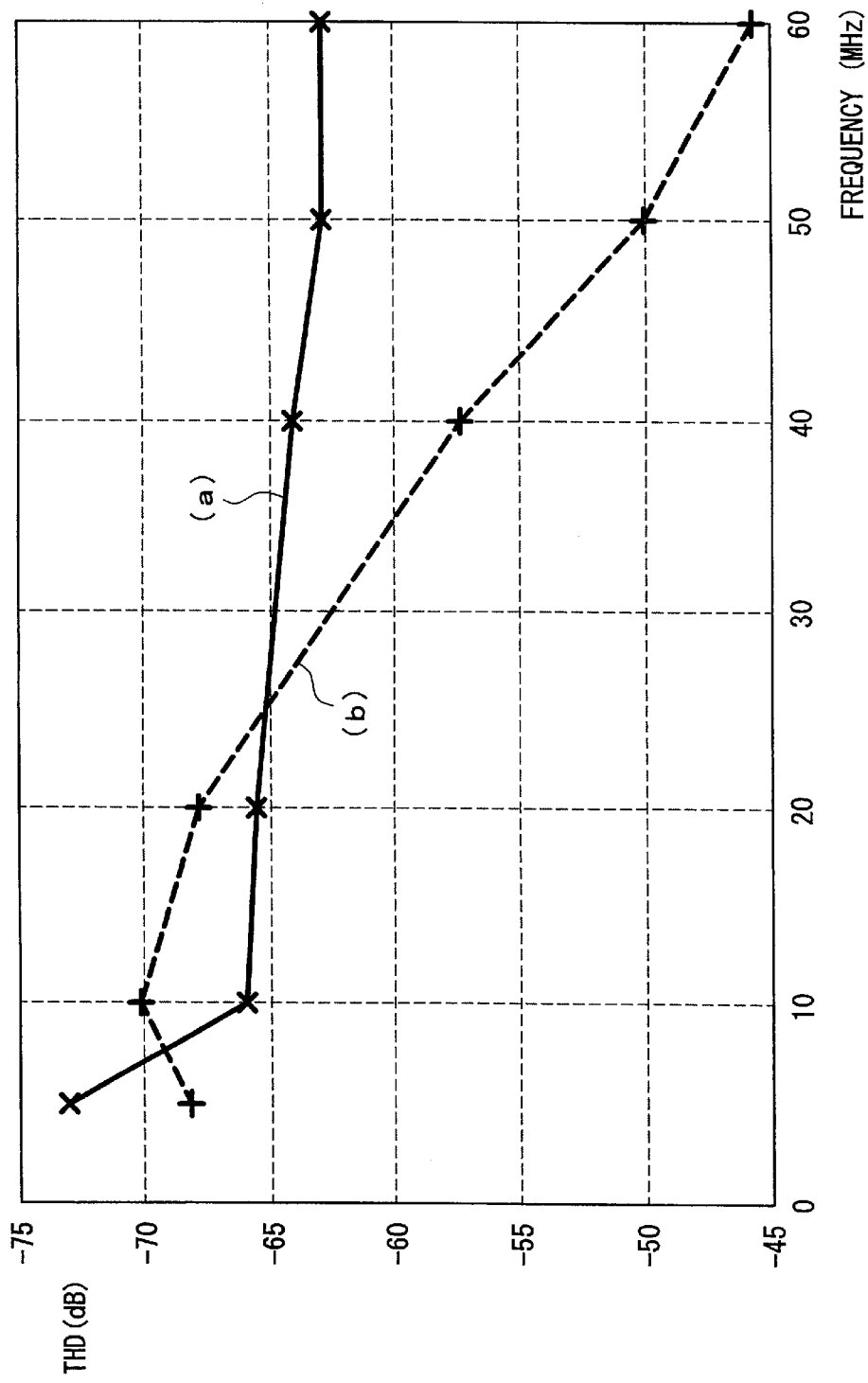
FIG. 5 is a graph illustrating relations between the frequency of input signals and total harmonic distortion in sampling and hold circuit 1 in FIG. 1.

FIG. 5 is a graph showing results obtained by simulating the relations between the frequency of input signals and total harmonic distortion THD for the difference of output signals in sampling and hold circuit 1. In FIG. 5, a curve (a) shows an example of characteristics of sampling and hold circuit 1, and a curve (b) shows the characteristics of a prior sampling and hold circuit, for example, sampling and hold circuit 100 in FIG. 7. As seen from FIG. 5, the distortion in sampling and hold circuit 1 is less than the distortion in a prior sampling and hold circuit.

Figure 7:
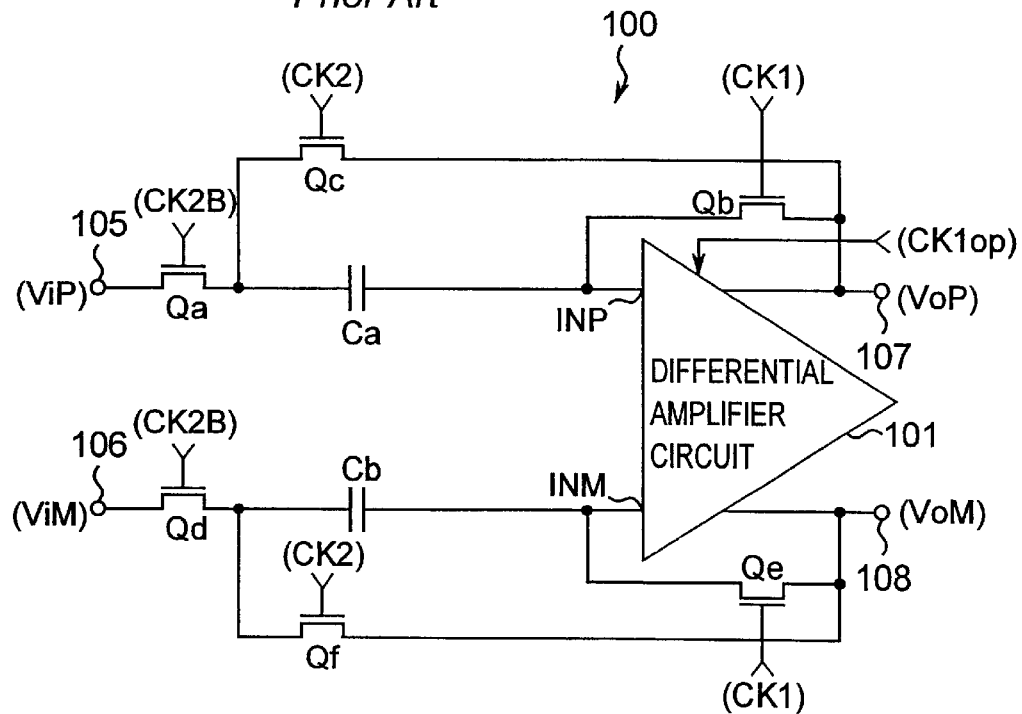
FIG. 7 is a circuitry diagram showing a prior sampling and hold circuit.
Figure 8:
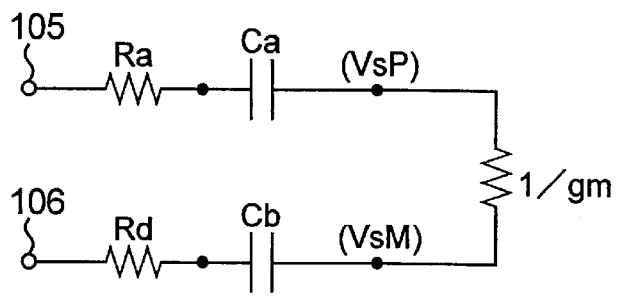
FIG. 8 is a circuitry diagram showing an equivalent circuit of the sampling and hold circuit in FIG. 7 during sampling operation.

FIGS. 6A and 6B are graphs showing results obtained by simulating the variation of the voltages VsP and VsM at virtual grounds during sampling operation and holding operation. FIG. 6A shows a case for a prior sampling and hold circuit, for example, sampling and hold circuit 100 in FIG. 7, and FIG. 6B shows a case for sampling and hold circuit 1 of the present invention. In FIGS. 6A and 6B, VsP is indicated by solid lines and VsM is indicated by dotted lines. As seen from FIG. 6A, the voltages VsP and VsM at virtual grounds in the prior sampling and hold circuit show different characteristics during sampling operation. However, in sampling and hold circuit 1 of the present invention, the voltages VsP and VsM at virtual grounds show almost the same characteristics during sampling operation, as seen from FIG. 6B.

As described so far, the sampling and hold circuit in the preferred embodiment can cancel the influence of analog signals input to positive-side input terminal 5 and negative-side input terminal 6 and the like during sampling operation at input terminals INP and INM of differential amplifier circuit 2 and can reduce the voltage variation at the two input terminals INP and INM of differential amplifier circuit 2, which are virtual grounds.

In the present embodiment, each transistor has been an NMOS transistor. However, the present invention is not limited to that case, and bipolar transistors and other various transistors can be used.

Although the present invention has been described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A sampling and hold circuit that samples and holds, at a predetermined timing, first and second input signals having mutually opposite voltage levels, said sampling and hold circuit comprising:

a first circuit section having a first capacitor that samples and holds said first input signal and having a predetermined impedance;

a second circuit section having a second capacitor that samples and holds said second input signal and having a predetermined impedance;

a differential amplifier section, the voltage held by said first capacitor in said first circuit section being input to a first input terminal of said differential amplifier section, and the voltage held by said second capacitor in said second circuit section being input to a second input terminal of said differential amplifier circuit section;

a third circuit section having a third capacitor that has the same capacitance as that of said first capacitor, having the same impedance as that of said first circuit section during sampling operation, and inputting said second input signal to said first input terminal of said differential amplifier circuit section; and a fourth circuit section having a fourth capacitor that has the same capacitance as that of said second capacitor, having the same impedance as that of said second circuit section during sampling operation, and inputting said first input signal to said second input terminal of said differential amplifier circuit section, wherein:

said first circuit section comprises said first capacitor and a first transistor, a predetermined voltage Vc1 being always applied to a control-signal input terminal of said first transistor;

said second circuit section comprises said second capacitor and a second transistor, a predetermined voltage Vc2 being always applied to a control-signal input terminal of said second transistor;

said third circuit section comprises said third capacitor and a third transistor, said second input signal being input to said third capacitor, and said third transistor being turned on to input said second input signal to said first input terminal of said differential amplifier circuit section; and said fourth circuit section comprises said fourth capacitor and a fourth transistor, said first input signal being input to said fourth capacitor, and said fourth transistor turning to "on" during sampling operation to input said first input signal to said second input terminal of said differential amplifier circuit section.

2. The sampling and hold circuit as defined in claim 1, wherein said predetermined voltage Vc1 is applied to said first transistor so that its equivalent resistance can become the same as the equivalent resistance of said third transistor while said third transistor is turned on, and said predetermined voltage Vc2 is applied to said second transistor so that its equivalent resistance can become the same as the equivalent resistance of said fourth transistor while said fourth transistor is turned on.

3. The sampling and hold circuit as defined in one of claim 1 or 2, wherein said third transistor is turned off during holding operation to cut off the connection between said third capacitor and said first input terminal of said differential amplifier circuit section, and said fourth transistor is turned off during holding operation to cut off the connection between said fourth capacitor and said second input terminal of said differential amplifier circuit section.

* * * * *